Figure 1:
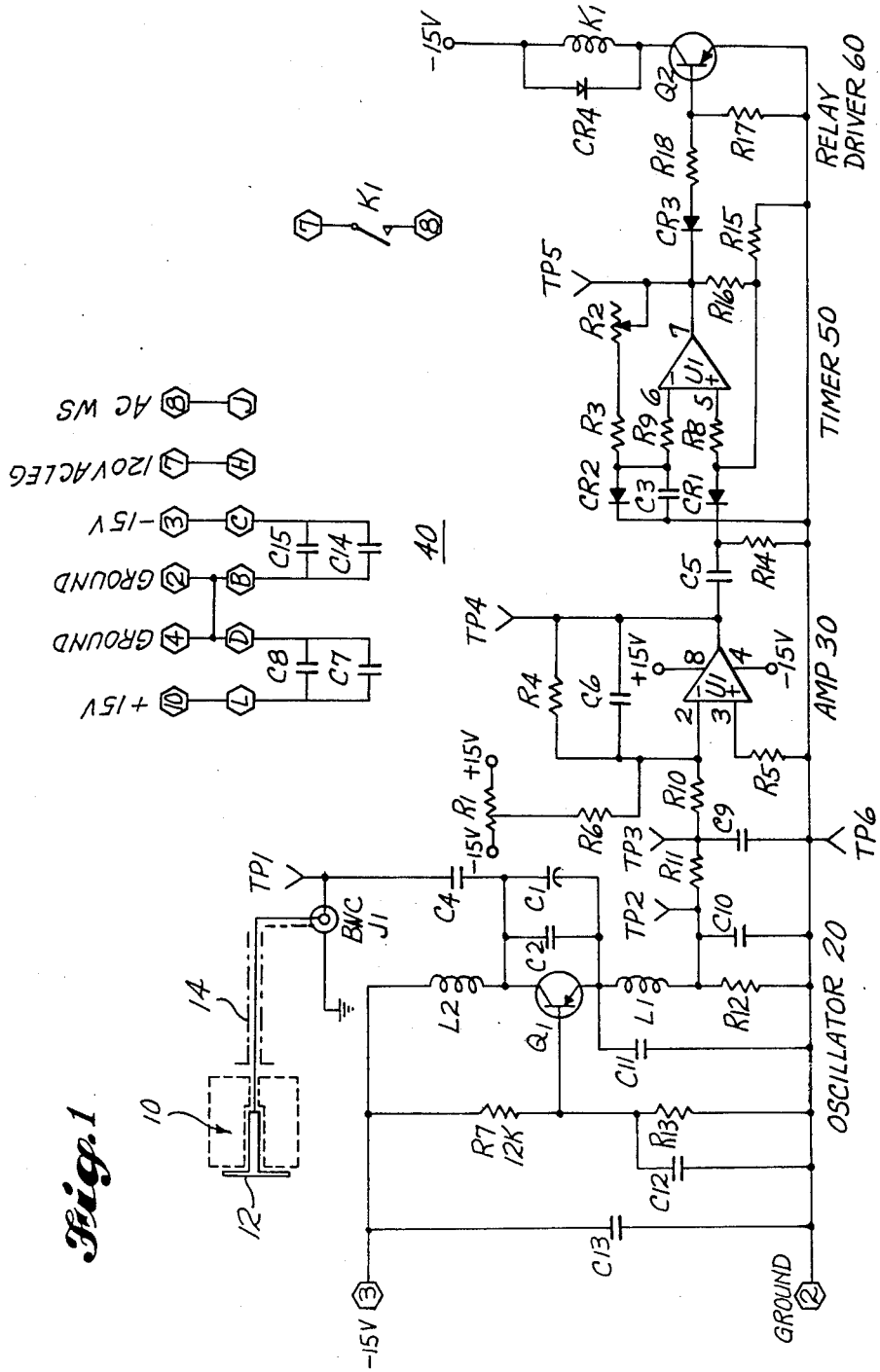

United States Patent [19]

Butcher et al.

[11] Patent Number: 4,679,117
[45] Date of Patent: Jul. 7, 1987

[54] TOUCH SENSOR FOR WIRE STRIPPER

[75] Inventors: William T. Butcher, Redmond; James J. Furlong, Seattle; Dwayne E. Howe, Kent, all of Wash.; Gerald T. Snell, Hillsboro, Oreg.; Calvin M. Yara, Kaneohe, Hi.

[73] Assignee: The Boeing Company, Seattle, Wash.

[21] Appl. No.: 839,661

[22] Filed: Mar. 14, 1986

Related U.S. Application Data

[63] Continuation-in-part of Ser. No. 362,020, Mar. 25, 1982, abandoned.

[51] Int. Cl.⁴ ............................................. H01H 47/12
[52] U.S. Cl. ........................................ 361/181; 331/65
[58] Field of Search .................... 361/179, 181; 331/65

[56] References Cited

U.S. PATENT DOCUMENTS

| | | | |
|---|---|---|---|
| 2,292,846 | 8/1942 | Pritchard | 361/181 |
| 2,775,283 | 12/1956 | Greer | 361/170 |
| 2,889,422 | 6/1959 | Dibner | 200/61.59 |
| 3,004,581 | 10/1961 | Krol et al. | 29/566.2 |
| 3,438,189 | 4/1969 | Gasser et al. | 361/181 |
| 3,571,666 | 3/1971 | McGuirk, Jr. | 361/203 |
| 3,575,640 | 4/1971 | Ishikawa | 361/181 |
| 3,725,808 | 4/1973 | Oushige et al. | 361/181 |
| 3,927,336 | 12/1975 | Carlson et al. | 361/181 |
| 4,169,982 | 10/1979 | Rittmann | 361/181 |
| 4,352,141 | 9/1982 | Kent | 361/181 |

Primary Examiner—L. T. Hix
Assistant Examiner—David M. Gray
Attorney, Agent, or Firm—Conrad O. Gardner; B. A. Donahue

[57] ABSTRACT

A wire detector for semi-automatic wire stripper which responds to capacitance changes caused by sensing a capacitance object such as an exposed wire end and includes signal processing through an oscillator and amplifier circuit providing timer control for activating a relay driver circuit for an adjustable duration time period. The wire touch sensor circuit relay driver is then coupled through a mercury wetted relay which provides electrical isolation from external (switched) voltages to an air solenoid which when actuated allows the pneumatic mechanism of the wire stripper to cycle through its functions of wire stripping.

1 Claim, 2 Drawing Figures

TOUCH SENSOR FOR WIRE STRIPPER

This application is a continuation-in-part of patent application Ser. No. 362,020, filed Mar. 25, 1982, now abandoned, and assigned to The Boeing Company.

The present invention relates to touch sensors for wire strippers and more particularly to a picofarad detector circuit which provides wire sensing through capacitance change in order to provide air solenoid control for allowing pneumatic mechanisms to cycle through their functions of wire stripping.

GENERAL BACKGROUND

The oscillator is designed to be resonant at approximately 25 megahertz. C1, the trimmer capacitor, is used to adjust the oscillator to a point close to where it will drop out of this basic resonant frequency. This is, of course, adjusting the sensitivity. When the oscillator is in resonance the operating level at TP2 and the filtered version at TP3 are at approximately −8 volts. When a hand-held wire touches the detector button the added capacitance drops the oscillator out of resonance to a much lower sawtooth shaped oscillation. The element detected, through, is the change in operating level (to −6 v approximately 2 volts) of the circuit at TP2 and TP3 (Incidentally, for a very short wire the primary source of the capacitance is the person holding the wire. If they squeeze the wire harder it increases the capacitance and, of course, the sensitivity or ability to strip an even smaller wire.) The change in level at TP3 is amplified approximately 16 times by the inverse amplifier stange. Since adjusting C1, the real threshold or sensitivity adjustment, will cause the operating level to change at TP2/TP3, the inverse amplifier's output level, in the quiescent state, must be kept near the +10 volt level. That is the purpose of totentiometer R1. Simply, adjusting C1 interacts with TP4 the output of the inverse amplifier. The level of +20 volt was chosen to allow as much negative swing, which triggers the one-shot, as possible. The timing circuit was a requirement because without it the circuit is fast enough that when the stripper operates it mechanically grips the wire and pulls the blades backward removing the stripped insulation and simultaneously removing the detector button and sensor connection. This allows the oscillator to quickly return to resonance and in effect arms the circuit for a retrigger. It will retrigger producing a machine gun effect. The delay allows the operator to withdraw the wire without a retrigger. The delay disarms the trigger output.

The prior art patent literature has included non-capacitance type wire contact switch means for actuating terminal crimping devices as shown in U.S. Pat. Nos. 2,775,283; 2,889,422; and, 3,004,581. The patent literature also includes capacitance type contact switching circuits as shown in U.S. Pat. Nos. 3,571,666; 3,725,808; 3,927,336; and, 4,169,982. A capacitance type contact sensing circuit utilized for sensing interruptions in a moving fiber strand has been disclosed heretofore as shown in U.S. Pat. No. 3,438,189.

In contrast, it is an object of the present invention to utilize capacitance tough wire sensing for starting a timer circuit to activate the wire stripper by engaging a solenoid valve.

In accordance with a preferred embodiment of the present invention, a touch sensor for wire stripper devices comprises a picofarad detector circuit responsive to initial contact wire change capacitance and incorporates an oscillator circuit, an inverse amplifier circuit, and timer circuit for activating a relay driver circuit.

Figure 2:
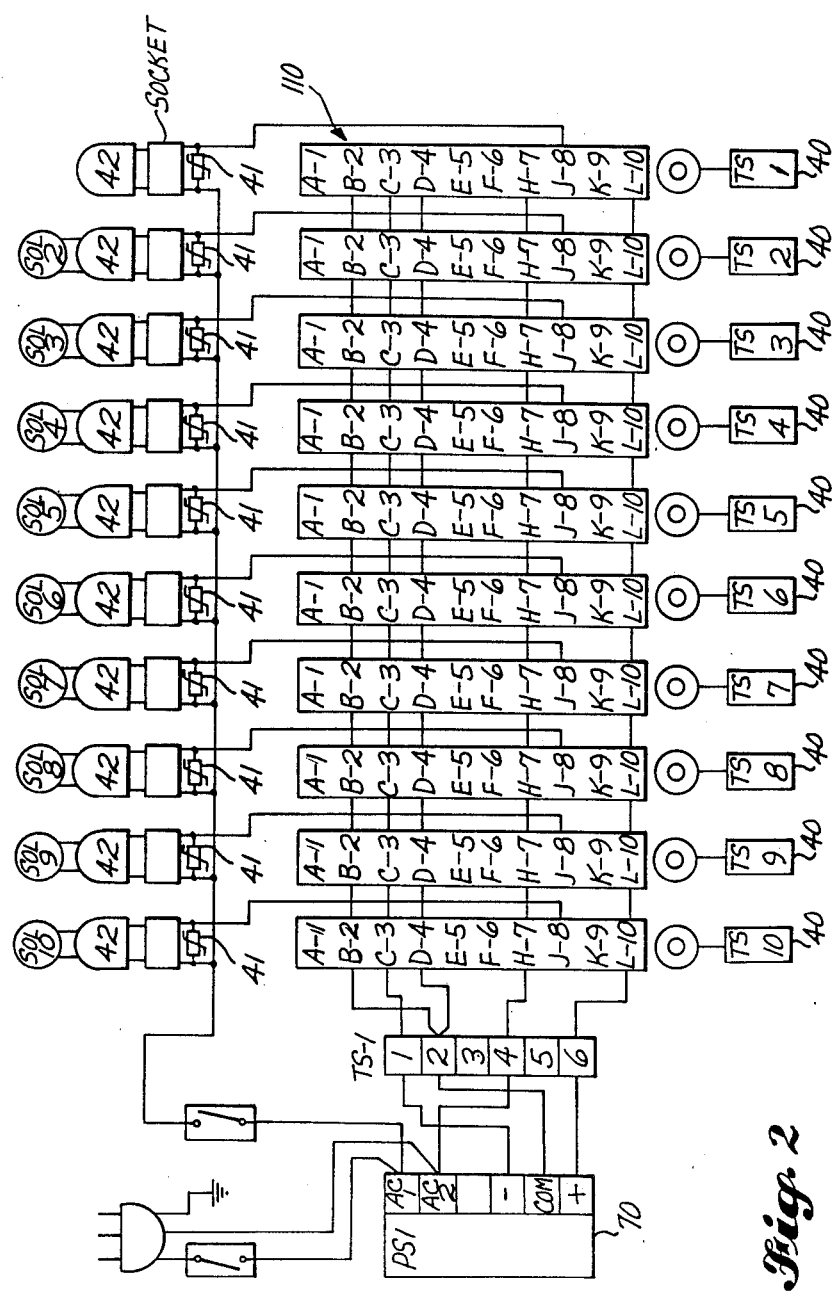

A full understanding of the invention, and of its further objects and advantages and the several unique aspects thereof, will be had from the following description when taken in conjunction with the accompanying drawings in which:

FIG. 1 is a schematic diagram of an adjustable picofarad detector circuit in accordance with a preferred embodiment of the invention; and, FIG. 2 is a system diagram showing a plurality of the touch sensor circuits of FIG. 1 utilized to actuate a plurality of wire stripper solenoids.

The present touch sensor circuit shown in FIG. 1 may be utilized ten times as shown in FIG. 2 at TS1 through 10 to control a corresponding number of solenoids for stripping a corresponding plurality of wires in known type wire stripping equipment. A capacitance sensor button 10 has an end plate 12 for contacting a (capacitive) wire (not shown) which changes capacitance of sensor lead 14. Contact plate 12 is coupled through a coaxial cable having a capacitance of forty to eighty picofarads through, as in input, to oscillator circuit 20 by means of input terminal J1. A capacitance change resulting from contact of the wire (not shown) causes the oscillator to drop out of its designed resonance of approximately 25 megahertz. This causes a change in the direct current (D.C.) operating level of the oscillator detector circuit 20. This change in D.C. level is amplified by the inverse amplifier circuit 30 and capacitively coupled to the timer circuit 50 which is triggered and generates an adjustable timed pulse which actives the relay driver circuit 60 for the duration of this pulse.

The minimum pulse width of the timer circuit 50 must exceed the time required for the stripper to actuate and complete a strip cycle properly. This is typically 30 milliseconds. The maximum time is determined by allowing sufficient time for the operator to withdraw the wire before the timing circuit expires. This prevents a retrigger which would allow an unwanted additional strip cycle. This value is nominally set at 70 to 100 milliseconds for most operators.

Turning now to FIG. 2, it can be seen that, in a wire stripping environment, a plurality of touch sensor circuits 40 deriving their power sources from power supply 70 are coupled through a corresponding number of mercury wetted relays 41 and socket connectors 42 to wire stripper or device actuating solenoids 1 through 10. A plurality of card edge type connectors 110 are utilized to connect the plurality of touch sensor circuits 40 to power supply source 70 with legends on connectors 110 corresponding to hexagonally tacked numerals on the sensor circuits shown at 40 in FIG. 1.

Electronic touch sensor circuit 40 shown in FIG. 1 which is utilized in a system such as shown in FIG. 2 for activating solenoids in a semi-automatic wire stripper is, as hereinbefore mentioned, an adjustable type picofarad detector circuit. Sensitivity and triggering the threshold of picofarad detector circuit 40 are interactively variable, thereby allowing precise tuning of the detector to specific ranges of sensitivity. The circuit is very sensitive. It allows the reliable stripping of single wires as short as 6 inches. Switch output duration is adjustable from twenty milliseconds to one second, and is isolated electrically from the circuit.

Circuit interaction in multiple circuit applications such as shown in FIG. 2 are controlled through isolation hereinbefore mentioned, thereby allowing maximum sensitivity adjustment to detect objects such as exposed ends of insulated wire coupled to plate 12 with as little as five picofarads of capacitance. Objects at (or near) ground potential may be detected at the other extreme of adjustment. Range settings may be established to the last specific detection margins within this broad range of contact detectability. Circuit components and values are detailed for oscillator circuit 20, amplifier circuit 30, timer circuit 50, and relay driver circuit 60 as shown in FIG. 1.

A number of test points marked TP1, TP2, etc. are shown in the schematic diagram of FIG. 1. Test point 1 relates to sensor cable 14 capacitance. This point permits the capacitance of the sensor cable to be checked. The capacitance should measure between forty and eighty picofarads.

Test point 6, marked TP6, is the circuit ground and should be used as the ground point for the oscilloscope used in the following descriptions.

Test point 2 relates to trigger verification. This point provides connection for verifying that the oscillator circuit 20 is properly functioning and is correctly triggering. An oscilloscope connected at this test point should display a saw-toothed waveform when the circuit is activated. The oscilloscope settings for horizontal sweep should be twenty microseconds per division and vertical magnitude set at five volts per division. Before triggering, a straight line appears on the scope and triggered, a saw-toothed waveform is displayed.

Test point 3, marked TP3, relates to sensitivity adjustment. An oscilloscope is connected to test point 3 and an 8-inch wire is inserted into the module to trigger it. Sensitivity should be adjusted for a maximum voltage shift on triggering. However, the module should not remain in the triggered mode after the solenoid valve shown in the system of FIG. 2 has opened. In this test, the oscilloscope settings should be horizontal sweeps twenty microseconds per division and vertical magnitude five volts per division.

Test point 4, marked TP4, tough sensor 40 of FIG. 1, requires the threshold voltage to be nominally set at +10 volts in the quiescent state. Since adjusting the sensitivity by adjusting trimcap C1 will interact with the threshold voltage of the inverse amplifier, the threshold adjustment must be made after any sensitivity adjustment. The threshold adjustment screw is identified as R1 in FIG. 1. The voltage should drop to −15 volts upon triggering the module. Oscilloscope settings should be horizontal sweeps at twenty microseconds per division and vertical magnitude at five volts per division (D.C. coupled).

A further test point, helpful in understanding circuit 40 function, relates to test point TP5 regarding ON time. The amount of time the module remains activated before it returns to its ready to strip condition is determined by the adjustment of screw marked R2 (variable potentiometer) which can be monitored at test point 5. As previously stated a nominal setting of 70 to 100 milliseconds is preferred for most operators. Longer times are fine, but shorter than 70 milliseconds are not needed. Since the minimum time is nominally 30 milliseconds, no setting close to this value is recommended. An oscilloscope setting in this test point should be horizontal sweep at twenty milliseconds per division and vertical magnitude at five volts per division. The oscilloscope should be placed in the STORAGE mode. The module at 10 should be activated by touching a test wire to the sensor plate 12 as in a normal wire stripping operation. Note the time duration of the blip in the display on the oscilloscope which conveys the ON time.

The wire stripping unit utilizing solenoids 1 through 10 in the system of FIG. 2 may be an Ideal Industries Power Stripmaster Model 45-145.

In an actual wire stripping environment, inserting a wire until it touches plate 12 of touch sensor circuit 40 results in triggering of the gripper jaws to hold the wire while the cutting blades strip off the insulation with air operation of jaws and blades.

In the exemplary adjustable picofarad detector circuit of FIG. 1, the component values are as follows:

| | | | |
|---|---|---|---|
| R1 | 50KΩ trimpot | C1 | 5–75 pF trimcap |
| R2 | 1MΩ trimpot | C2 | 22 pF |
| R3 | 100KΩ | C3 | 1.0 μF |
| R4 | 470KΩ | C4 | 470 pF |
| R5 | 10KΩ | C5 | 1.0 μF |
| R6 | 30KΩ | C6 | .1 μF |
| R7 | 12KΩ | C7 | .1 μF |
| R8 | 10KΩ | C8 | 33 μF |
| R9 | 10KΩ | C9 | .1 μF |
| R10 | 30KΩ | C10 | .1 μF |
| R11 | 10KΩ | C11 | 47 pF |
| R12 | 1.8KΩ | C12 | .1 μF |
| R13 | 5.6KΩ | C13 | .1 μF |
| R14 | 100KΩ | C14 | .1 μF |
| R15 | 15KΩ | C15 | 33 μF |
| R16 | 100KΩ | Q1 | 2N869A |
| R17 | 2.2KΩ | Q2 | 2N3906 |
| R18 | 1KΩ | U1 | MC1458P Dual Op. Amp |
| CR1 | 1N459 | | Probe - ~80 pF (40–80 pF) |
| CR2 | 1N459 | | (Isolated capacitance sensor) |
| CR3 | 1N459 | | J1 -UG-1098/U BNC Bulkhead |
| CR4 | 1N459A | | Receptacle |
| L1 | 82 μH | | TP1-6 - Horizontal Jack |
| L2 | 07 μH | | |
| K1 | Relay, mercury wetted | | |

We claim:

1. An adjustable picofarad detector circuit comprising in combination:

a capacitance sensing probe having an electrically conductive plate member;

an oscillator circuit coupled to said capacitance sensing probe;

a timer circuit;

an inverse amplifier circuit coupled between said oscillator circuit and said timer circuit for providing a discrete level output signal thereby triggering said timer circuit;

a relay driver circuit responsive to said timer circuit for an adjustable time period; and further including an air solenoid, and a mercury wetted relay coupled between said relay driver circuit and said air solenoid, said air solenoid when actuated permitting pneumatic mechanism cycling for wire stripping.

* * * * *